(12) United States Patent
Midori et al.

(10) Patent No.: US 11,486,917 B2
(45) Date of Patent: Nov. 1, 2022

(54) ELECTROMAGNETIC WAVE MEASUREMENT POINT CALCULATION DEVICE AND RADIATION INTERFERENCE WAVE MEASUREMENT DEVICE

(71) Applicant: TDK CORPORATION, Tokyo (JP)

(72) Inventors: Masataka Midori, Tokyo (JP); Hiroshi Kurihara, Tokyo (JP); Tomohiro Honya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 845 days.

(21) Appl. No.: 16/356,874

(22) Filed: Mar. 18, 2019

(65) Prior Publication Data

US 2019/0293702 A1 Sep. 26, 2019

(30) Foreign Application Priority Data

Mar. 20, 2018 (JP) .............................. JP2018-053487

(51) Int. Cl.
*G01R 29/08* (2006.01)

(52) U.S. Cl.
CPC ..... *G01R 29/0814* (2013.01); *G01R 29/0892* (2013.01)

(58) Field of Classification Search
CPC ............ G01R 29/0814; G01R 29/0892; G01R 31/001; G01R 29/0871; G01R 29/0857; H01Q 19/062
See application file for complete search history.

(56) References Cited

U.S. PATENT DOCUMENTS

| | | | |
|---|---|---|---|
| 2006/0262031 A1* | 11/2006 | Kuroda | H01Q 19/062 343/911 L |
| 2007/0024293 A1* | 2/2007 | Kosaka | G01R 31/001 324/754.21 |
| 2015/0042309 A1* | 2/2015 | Kurihara | G01R 29/0871 324/76.11 |
| 2017/0276712 A1 | 9/2017 | Midori et al. | |

FOREIGN PATENT DOCUMENTS

| | | | |
|---|---|---|---|
| EP | 1615041 A1 * | 1/2006 | ......... G01R 29/0857 |
| JP | 2017-181104 A | 10/2017 | |

* cited by examiner

*Primary Examiner* — Catherine T. Rastovski
*Assistant Examiner* — Kaleria Knox
(74) *Attorney, Agent, or Firm* — Oliff PLC (57) ABSTRACT

An electromagnetic wave measurement point calculation device of the present invention is an electromagnetic wave measurement point calculation device that is configured to calculate a plurality of measurement points of an electromagnetic wave set on a surface surrounding a radiation source of the electromagnetic wave. The electromagnetic wave measurement point calculation device includes an arithmetic processing unit configured to calculate a measurement interval between a first measurement point and a second measurement point adjacent to the first measurement point using a correction coefficient determined according to the first measurement point and execute an electromagnetic wave measurement point calculation process for sequentially calculating the plurality of measurement points in a measurement range.

4 Claims, 7 Drawing Sheets

ELECTROMAGNETIC WAVE MEASUREMENT POINT CALCULATION DEVICE AND RADIATION INTERFERENCE WAVE MEASUREMENT DEVICE

BACKGROUND OF THE INVENTION

Field of the Invention

The present invention relates to an electromagnetic wave measurement point calculation device and a radiation interference wave measurement device.

Priority is claimed on Japanese Patent Application No. 2018-053487, filed Mar. 20, 2018, the content of which is incorporated herein by reference.

Description of Related Art

Tests for measuring a radiation interference wave radiated from an electronic apparatus and the like are conducted by internationally determined test conditions and test methods, a height of a reception antenna is changed at a position away from a radiation source of a radiation interference wave by a predetermined distance and an angle of a specimen is changed to find a position where an intensity of an electric field (electric field intensity) is a maximum, and a final test at that position is implemented. An example of a radiation interference wave measurement device is disclosed in, for example, Japanese Unexamined Patent Application, First Publication No. 2017-181104.

SUMMARY OF THE INVENTION

In order to search for a position where the maximum electric field intensity is able to be obtained, it is necessary to measure the electric field intensity for each height of the antenna and each angle of the specimen, and the number of measurement points becomes very large. In a case where the radiation interference wave measurement in which a frequency range of 30 MHz to 1000 MHz of an information communication apparatus, which is a range of a frequency (measurement frequency) to be measured is made an example, it is necessary to change the antenna height to 1 m to 4 m and the angle of the specimen to 0° to 360°, and for example, in a case where the measurement is implemented at 1 cm intervals and 1° intervals, the number of measurement points is a very large number of 140,000 points and a measurement time becomes very long.

As described above, the time required for searching for the antenna height and the specimen angle (hereinafter referred to as a maximum electric field intensity position) at which the maximum electric field intensity is able to be obtained may be very long. Therefore, the radiation interference wave measurement device disclosed in Japanese Unexamined Patent Application, First Publication No. 2017-181104 measures the electric field intensity at measurement intervals equal to or less than ½ of a wavelength of a measurement frequency, and interpolates the electric field intensities of the points between the measurement points. Thus, a measurement time is shortened by reducing the number of measurement points. However, since Japanese Unexamined Patent Application, First Publication No. 2017-181104 does not disclose a technology for optimizing a measurement interval, it is desired to shorten the measurement time by further reducing the number of measurement points.

The present invention has been made in consideration of such circumstances, and an object of the present invention is to provide an electromagnetic wave measurement point calculation device and a radiation interference wave measurement device capable of shortening a measurement time of a maximum electric field intensity position.

(1) According to an aspect of the present invention, an electromagnetic wave measurement point calculation device is an electromagnetic wave measurement point calculation device that is configured to calculate a plurality of measurement points of an electromagnetic wave set on a surface surrounding a radiation source of the electromagnetic wave. The electromagnetic wave measurement point calculation device includes a first arithmetic processing unit configured to calculate a measurement interval between a first measurement point and a second measurement point adjacent to the first measurement point using a correction coefficient determined according to the first measurement point and execute an electromagnetic wave measurement point calculation process for sequentially calculating the plurality of measurement points in a measurement range.

(2) According to an aspect of the present invention, a radiation interference wave measurement device is a radiation interference wave measurement device that obtains a position at which a maximum electric field intensity of an electric field intensity distribution formed on a surface surrounding a radiation source is able to be obtained. The radiation interference wave measurement device includes the electromagnetic wave measurement point calculation device according to (1) described above, an electric field intensity measurement device, and a second arithmetic processing unit. The electric field intensity measurement device includes an antenna configured to detect an electric field intensity, a position control mechanism capable of changing a relative position of the antenna with respect to the radiation source, and a control unit configured to control measurement of the electric field intensity using the antenna and a position control mechanism. The control unit is configured to execute a first operation of setting a plurality of measurement points calculated by the electromagnetic wave measurement point calculation device on the surface surrounding the radiation source, and is configured to execute a second operation of measuring the electric field intensity of a frequency to be measured at the plurality of measurement points by using the antenna while controlling the position control mechanism. The second arithmetic processing unit is configured to perform a first arithmetic process of inputting zero to the electric field intensity between two adjacent measurement points in the electric field intensity distribution of the plurality of measurement points measured by the second operation, a second arithmetic process of applying a digital low pass filter of which the frequency to be measured is a cut-off frequency to the electric field intensity distribution obtained by the first arithmetic process, and a third arithmetic process of specifying the position at which the maximum electric field intensity is able to be obtained from the electric field intensity distribution obtained by the second arithmetic process.

According to the present invention, it is possible to obtain an effect of shortening a measurement time of a maximum electric field intensity position.

DETAILED DESCRIPTION OF THE INVENTION

[Estimation Principle]

Hereinafter, an outline of the estimation principle of the present invention will be described.

In a case where a square of an electric field intensity E at a certain arbitrary point is expressed by using Expression, the square of the electric field intensity E is able to be expressed as the following Expression (1).

$$|E|^2 = |\Sigma(a_i+jb_i)\exp(jkr_i)|^2 = (\Sigma a_i \cos(kr_i) - b_i \sin(kr_i))^2 + (\Sigma a_i \sin(kr_i) + b_i \cos(kr_i))^2$$

$$|E|^2 = \Sigma\Sigma(a_i \cos(kr_i) - b_i \sin(kr_i))\cdot(a_j \cos(kr_j) - b_j \sin(kr_j)) + (a_i \sin(kr_i) + b_i \cos(kr_i))\cdot(a_j \sin(kr_j) + b_j \cos(kr_j))$$

$$|E|^2 = \Sigma\Sigma(a_i a_j + b_i b_j)\cos(k(r_i-r_j)) + (a_i b_j - a_j b_i)\sin(k(r_i-r_j)) \quad (1)$$

where, $a_i$, $a_j$, $b_i$, and $b_j$ are coefficients, k is a wave number, and $r_i$ and $r_j$ are distances between an observation point and a radiation source.

From Expression (1), it can be seen that the electric field intensity is a sum of sinusoidal waves oscillating with respect to "$r_i-r_j$". Since the wave number is a value obtained by dividing $2\pi$ by a measurement frequency, according to the sampling theorem, it is possible to completely reproduce a waveform by measuring at a sampling interval of the following Expression (2).

$$\Delta(r_i - r_j) \leq \frac{\lambda}{2} \quad (2)$$

where, $\lambda$ is a wavelength of the electromagnetic wave to be measured.

(Measurement Interval in Height Direction of Antenna)

First, the measurement interval of the height direction of an antenna (reception antenna) that detects the electric field intensity will be described.

In a case where $r_i$ and $r_j$ are expressed as a function of the reception antenna height, $r_i$ and $r_j$ are able to be expressed by the following Expression (3).

$$r_i = \sqrt{d_i^2 + (h_{rx}-h_i)^2}$$

$$r_j = \sqrt{d_j^2 + (h_{rx}-h_j)^2} \quad (3)$$

where $d_i$ is a magnitude of a horizontal component of a vector between a radiation source i and an observation point (reception antenna position).

$d_j$ is a magnitude of a horizontal component of a vector between a radiation source j and the observation point (reception antenna position).

$h_{rx}$ is the reception antenna height.

$h_i$ is the position of the height direction of the radiation source i. Since it is prescribed that measurement of a radiation disturbance wave of which a range of a measurement frequency is from 30 MHz to 1000 MHz is performed on a metal floor surface, $h_i$ has positive and negative values in consideration of a mirror image principle.

$h_j$ is the position of the height direction of the radiation source j. Since it is prescribed that measurement of a radiation disturbance wave of which a range of a measurement frequency is from 30 MHz to 1000 MHz is performed on a metal floor surface, $h_j$ has positive and negative values in consideration of a mirror image principle.

A relationship expression between $\Delta(r_i-r_j)$ and the reception antenna height is able to be expressed by the following Expression (4).

$$\Delta(r_i - r_j) = \frac{\partial(r_i - r_j)}{\partial h_{rx}} \Delta h_{rx} = K_h \Delta h_{rx} \quad (4)$$

$$K_h = \frac{h_{rx} - h_i}{\sqrt{d_i^2 + (h_{rx}-h_i)^2}} - \frac{h_{rx} - h_j}{\sqrt{d_j^2 + (h_{rx}-h_j)^2}}$$

From a condition of the following Expression (5), a condition that an absolute value of $K_h$ becomes a maximum is able to be expressed by the following Expression (6).

$$\frac{\partial K_h}{\partial h_i} \geq 0, \; \frac{\partial k_h}{\partial h_j} \geq 0, \; \frac{\partial K_h}{\partial d_i} \leq 0, \; \frac{\partial K_h}{\partial d_j} \leq 0 (h_{rx} \leq |h_j|), \quad (5)$$

$$\frac{\partial K_h}{\partial d_j} \geq 0 (h_{rx} \geq |h_j|)$$

$$K_{hmax}(h_{rx}) = \quad (6)$$

$$\frac{h_{rx} - h_{max}}{\sqrt{d_{min}^2 + (h_{rx}-h_{max})^2}} - \frac{h_{rx} - h_{max}}{\sqrt{d_{min}^2 + (h_{rx}-h_{max})^2}} (h_{rx} \leq h_{max})$$

$$\frac{h_{rx} + h_{max}}{\sqrt{d_{min}^2 + (h_{rx}+h_{max})^2}} - \frac{h_{rx} - h_{max}}{\sqrt{d_{max}^2 + (h_{rx}-h_{max})^2}} (h_{rx} \geq h_{max})$$

where, $d_{min}$ is a minimum value of a magnitude of a horizontal component of the vector between the radiation source that is present at the specimen and the observation point (reception antenna position).

$d_{max}$ is a maximum value of the magnitude of the horizontal component of the vector between the radiation source that is present at which the specimen and the observation point (reception antenna position).

$h_{max}$ is a maximum height of the radiation source that is present at which the specimen. In a case where a position of the radiation source is unknown, $h_{max}$ is set as a distance from a floor to a maximum height size of the specimen.

Note that, in the above Expression (6), $d_{max}$ and $d_{min}$ correspond to the "distance between the radiation source and the antenna that detects the electric field intensity of the electric field intensity distribution formed on the surface surrounding the radiation source" and the "size of the radiation source" in the claims.

$h_{max}$ corresponds to the "height of the radiation source" in the claims.

$h_{rx}$ corresponds to the "height of the antenna" in the claims.

From the above, in a case where the measurement interval of the height direction of the reception antenna satisfies the following Expression (7), the sampling theorem is able to be satisfied.

$$\Delta h_{rx}(h_{rx}) \leq \frac{\lambda}{2K_{hmax}} \quad (7)$$

However, in addition to Expression (7), in consideration of a case where the coefficients "$a_i$, $a_j$, $b_i$, and $b_j$" is a trigonometric function in a wave number "k=0", it is necessary to satisfy the following Expression (8).

$$\arctan\left(\frac{h_{rx\_min} + h_{min}}{d_{min}}\right) \leq \frac{\pi}{4} \quad (8)$$

(Measurement Interval in Angular Direction of Specimen)

Next, the measurement interval of the angular direction of the specimen will be described.

In a case where $r_i$ and $r_j$ are expressed as a function of the specimen angle, $r_i$ and $r_j$ are able to be expressed by the following Expression (9).

$$r_i = \sqrt{(d\cos(\theta_{rx}) - R_i\cos(\theta_i))^2 + (d\sin(\theta_{rx}) - R_i\sin(\theta_i))^2 + (h_{rx} - h_i)^2} \quad (9)$$
$$= \sqrt{d^2 - 2dR_i\cos(\theta_{rx} - \theta_i) + R_i^2 + (h_{rx} - h_i)^2}$$

$$r_j = \sqrt{(d\cos(\theta_{rx}) - R_j\cos(\theta_j))^2 + (d\sin(\theta_j) - R_{tx1}\sin(\theta_j))^2 + (h_{rx} - h_j)^2}$$
$$= \sqrt{d^2 - 2dR_j\cos(\theta_{rx} - \theta_j) + R_j^2 + (h_{rx} - h_j)^2}$$

where d is a magnitude of a horizontal component of a vector between a specimen center (a center of a specimen) and the observation point (reception antenna position). The specimen center is a center of a size of the specimen.

$\theta_{rx}$ is an angle formed by a vector between a point at which the specimen center is projected on a horizontal plane and a point at which the observation point (reception antenna position) is projected on the horizontal plane, and a coordinate axis of a base on the horizontal plane.

$R_i$ is a magnitude of a horizontal component of a vector between the specimen center and the radiation source i.

$R_j$ is a magnitude of a horizontal component of a vector between the specimen center and the radiation source j.

$\theta_i$ is an angle formed by a vector between the point at which the specimen center is projected on the horizontal plane and a point at which the radiation source i is projected on the horizontal plane, and the coordinate axis of the base on the horizontal plane.

$\theta_j$ is an angle formed by a vector between the point at which the specimen center is projected on the horizontal plane and a point at which the radiation source j is projected on the horizontal plane, and the coordinate axis of the base on the horizontal plane.

$h_{rx}$ is the reception antenna height.

The relation expression between $\Delta(r_i - r_j)$ and the specimen angle is able to be expressed by the following Expression (10).

$$\Delta(r_i - r_j) = \frac{\partial(r_i - r_j)}{\partial \theta}\Delta\theta = K_\theta \Delta\theta \quad (10)$$

$$K_\theta = \frac{R_i \sin(\theta_{rx} - \theta_i)}{\sqrt{d^2 - 2dR_i\cos(\theta_{rx} - \theta_i) + R_i^2 + (h_{rx} - h_i)^2}} -$$
$$\frac{R_j \sin(\theta_{rx} - \theta_j)}{\sqrt{d^2 - 2dR_j\cos(\theta_{rx} - \theta_j) + R_j^2 + (h_{rx} - h_j)^2}}$$

From a condition of the following Expression (11), a condition that an absolute value of $K_\theta$ becomes maximum is able to be expressed by the following Expression (12).

$$\sin(\theta_{rx} - \theta_i) \geq 0, \sin(\theta_{rx} - \theta_j) \leq 0, \quad (11)$$
$$\frac{\partial K_\theta}{\partial R_i} \geq 0 \left(\frac{R_i}{d} < 1\right), \frac{\partial K_\theta}{\partial R_j} \geq 0 \left(\frac{R_j}{d} < 1\right)$$

$$K_{\theta max} = \frac{2R_{max}\sin(\theta)}{\sqrt{d^2 - 2dR_{max}\cos(\theta) + R_{max}^2}} \quad (12)$$

$$\theta = \theta_{rx} - \theta_i = \theta_{rx} - \theta_j$$

where, $R_{max}$ is a maximum value of a horizontal component of a vector between the specimen center and the radiation source that is present at which the specimen. In a case where the position of the radiation source is unknown, $R_{max}$ corresponds to the size on the horizontal plane of the specimen.

A local maximum point of $K_{\theta max}$ is expressed by the following Expression (13).

$$\frac{\partial K_{\theta max}}{\partial \theta} = 0 \quad (13)$$

$$\theta = -\arccos\left(\frac{R_{max}}{d}\right)$$

$$K_{\theta max} = \frac{2R_{max}}{d}$$

From the above, in a case where the measurement interval in the angular direction of the specimen satisfies the following Expression (14), the sampling theorem is able to be satisfied.

$$\Delta\theta_{rx} \leq \frac{\lambda}{4R_{max}} \quad (14)$$

However, in addition to Expression (14), in consideration of a case where the coefficients "$a_i$, $a_j$, $b_i$, and $b_j$" are a trigonometric function in a wave number "k=0", it is necessary to satisfy the following Expression (15).

$$\Delta\theta_{rx} \leq \frac{\pi}{4} \quad (15)$$

As described above, in a case where the measurement interval in the height direction of the measurement point is able to satisfy Expression (7) and Expression (8) and the measurement interval in the angular direction of the measurement point is able to satisfy Expression (14) and Expression (15), it can be seen that it is possible to completely reproduce the electric field intensity distribution from the sampling theorem. In a case where the measurement point is determined on the basis of such conditions, it is possible to shorten the measurement time by reducing the number of measurement points and to specify the maximum electric field intensity position by the electric field intensity distribution restored from a measurement result.

Embodiment

Hereinafter, an embodiment of the invention based on the present invention will be described in detail.

Figure 1:
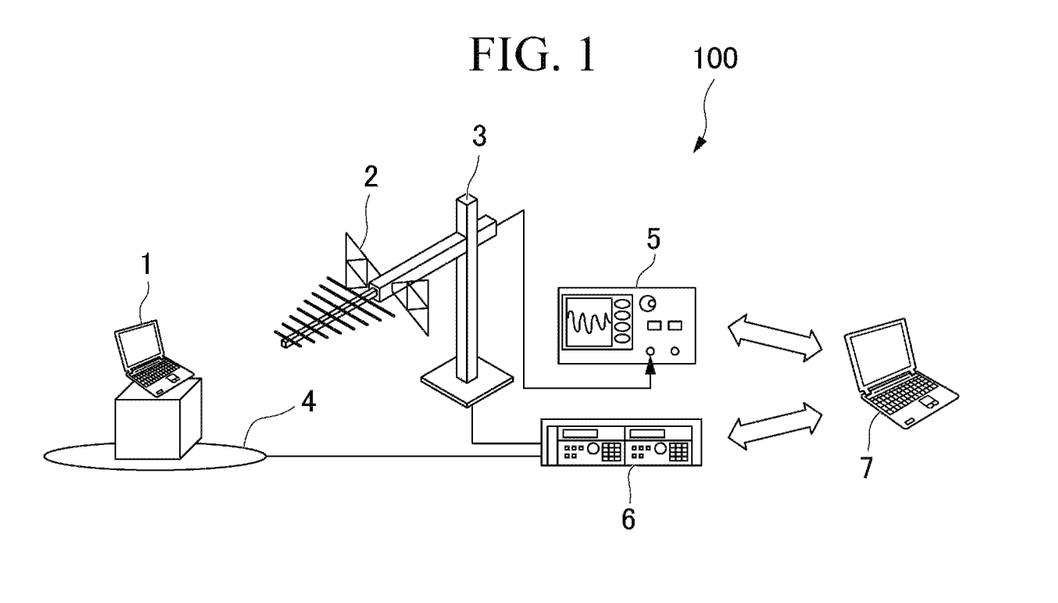
FIG. 1 is a schematic diagram showing a radiation interference wave measurement device according to an embodiment of the present invention.

First, a radiation interference wave measurement device 100 according to an embodiment of the present invention will be described with reference to FIG. 1. The radiation interference wave measurement device 100 according to the present invention includes a reception antenna 2, an antenna mast 3 that raises and lowers the reception antenna 2, a turntable 4 that rotates a specimen 1, a receiver 5 that measures electric field intensity, a controller 6 that controls the antenna mast 3 and the turntable 4, and a computer 7. In addition, the antenna mast 3 and the turntable 4 are connected to the controller 6 by, for example, a communication cable, and the receiver 5 and the controller 6 are connected to the computer 7 by, for example, a communication cable. The computer 7 realizes an electromagnetic wave measurement point calculation function for calculating a measurement point of a radiation interference wave (electromagnetic wave), a control function for controlling the receiver 5 and the controller 6 to control the measurement of electric field intensity, and a maximum electric field intensity position specifying function for specifying a maximum electric field intensity position using the measurement point, and the like by executing a computer program.

Figure 2:
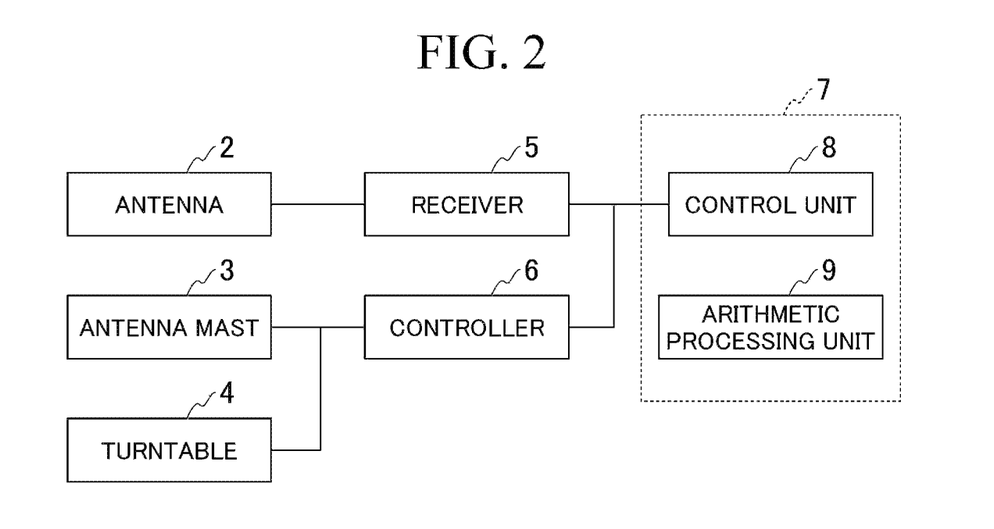
FIG. 2 is a block diagram showing main components of the radiation interference wave measurement device according to an embodiment of the present invention.

FIG. 2 is a block diagram showing principal components of the radiation disturbance wave measurement device 100 according to the present invention. As shown in FIG. 2, the radiation disturbance wave measurement device 100 according to the present embodiment includes the reception antenna 2, the antenna mast 3 that raises and lowers the reception antenna 2, the turntable 4 that rotates the specimen 1, the receiver 5 that measures the electric field intensity, the controller 6 that controls the antenna mast 3 and the turntable 4, a control unit 8 that controls measurement, and an arithmetic processing unit 9. A process performed by the arithmetic processing unit 9 will be described later in detail. In the present embodiment, the control unit 8 and the arithmetic processing unit 9 are realized by the computer 7. In the present embodiment, the antenna mast 3, the turntable 4, and the controller 6 constitute a position control mechanism in the claims, and the receiver 5 and the control unit 8 constitute a control unit in the claims.

Figure 3:
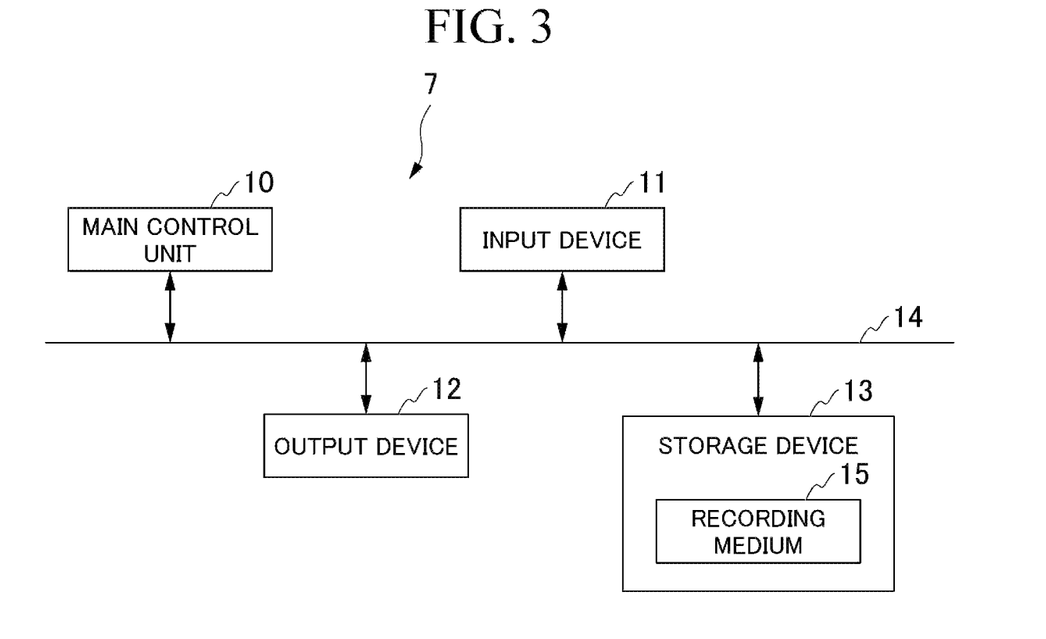
FIG. 3 is a block diagram showing a constitution of a computer in FIG. 2.

FIG. 3 is a block diagram showing a hardware constitution of the computer 7 in FIG. 2. The computer 7 includes a main control unit 10, an input device 11, an output device 12, a storage device 13, and a bus 14 that connects them to each other. The main control unit 10 has a central processing unit (CPU) and a random access memory (RAM). The input device 11 is used for inputting information necessary for operation of the radiation interference wave measurement device and instructing various operations. The output device 12 is used for outputting (including display) various kinds of information related to the operation of the radiation interference wave measurement device.

A form of the storage device 13 is not limited as long as the storage device 13 is able to store information, but the storage device 13 may be, for example, a hard disk device or an optical disc device. In addition, the storage device 13 records information on the computer-readable recording medium 15 and reproduces the information from the recording medium 15. The recording medium 15 is, for example, a hard disk or an optical disc. The recording medium 15 may be a recording medium on which a computer program for realizing the control unit 8 and the arithmetic processing unit 9 shown in FIG. 2 is recorded.

The main control unit 10 realizes functions of the control unit 8 and the arithmetic processing unit 9 shown in FIG. 2, for example, by executing the computer program recorded on the recording medium 15 of the storage device 13. Note that the control unit 8 and the arithmetic processing unit 9 shown in FIG. 2 are not physically separated elements and are realized by software.

Figure 4:
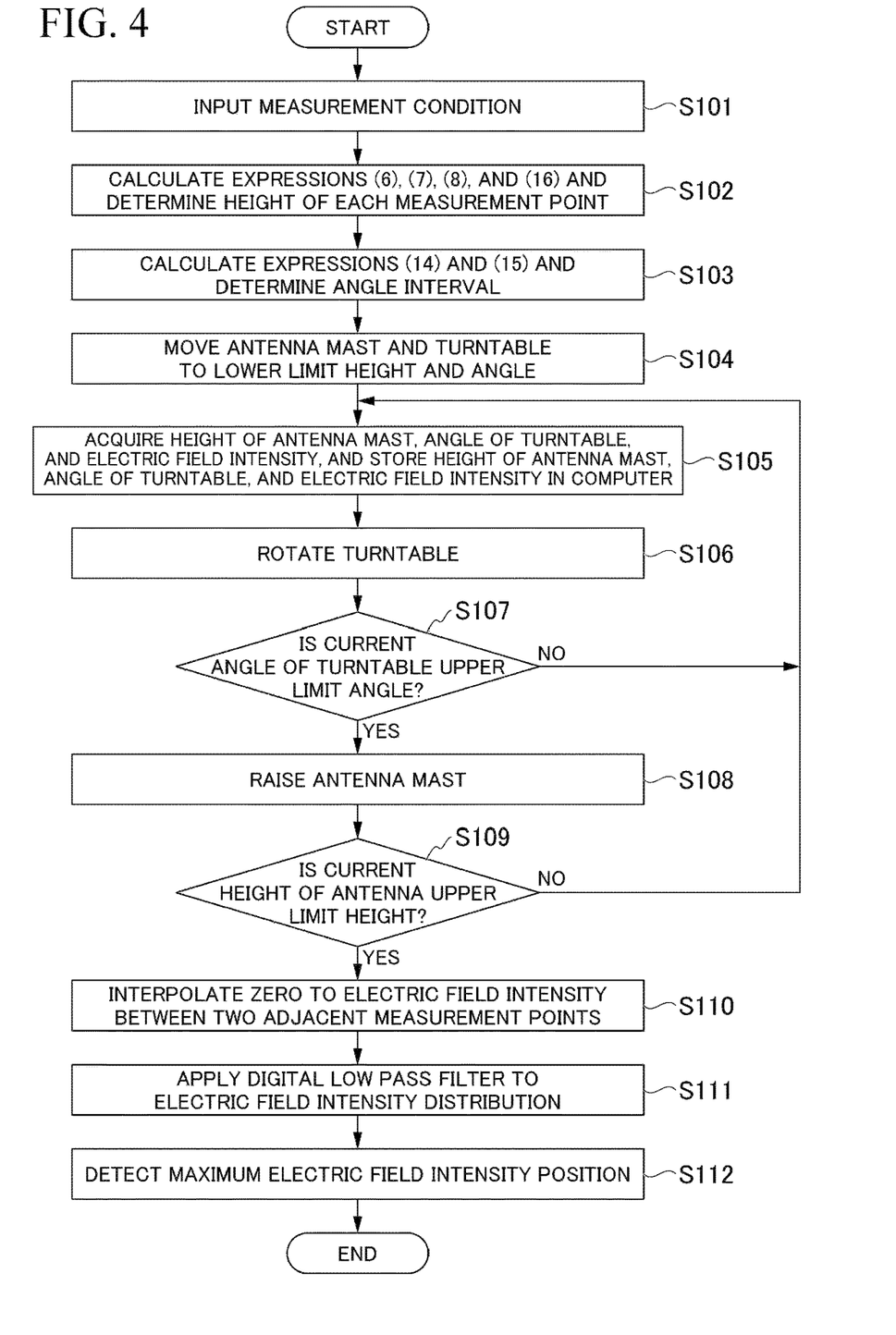
FIG. 4 is a flowchart showing a procedure of a maximum electric field intensity position estimation method according to the embodiment of the present invention.

Hereinafter, a series of operations of a maximum electric field intensity position estimation method implemented by using the radiation interference wave measurement device 100 will be described with reference to a flowchart of FIG. 4. FIG. 4 is a flowchart showing a procedure of the maximum electric field intensity position estimation method according to the embodiment of the present invention.

In step S101, an operator inputs measurement conditions such as a measurement frequency, the distance in a horizontal direction from the specimen 1, the size of the specimen 1 in the horizontal direction, the height of the specimen 1, the range of a measurement point height, and the like to the computer 7. The specimen 1 includes a radiation source of an electromagnetic wave having the measurement frequency.

In step S102, the arithmetic processing unit 9 calculates a measurement interval "$\Delta h_{rx}(h_{rx})$" in the height direction so that "$Kh_{max}\Delta h_{rx}(h_{rx})$" is constant by using Expression (6), Expression (7), and Expression (8), and calculates heights of each measurement point by the following Expression (16). In calculating the heights of each measurement point, the heights of each measurement point are determined such that a lower limit and an upper limit of the measurement point height range satisfy Expression (16). Note that $K_{hmax}(h_{rx})$ calculated by using Expression (6) is a correction coefficient determined according to the height $h_{rx}$ of a first measurement point.

$$h_{rx,0} = h_{rx\_min}$$

$$h_{rx,1} = h_{rx\_min} + \Delta h_{rx}(h_{rx,0})$$

$$h_{rx,k} = h_{rx,k-1} + \Delta h_{rx}(h_{rx,k-1}) \, (k \geq 2) \quad (16)$$

In step S103, the arithmetic processing unit 9 calculates an angular interval by using Expression (14) and Expression (15).

In step S104, the controller 8 performs an operation of moving the antenna mast 3 and the turntable 4 to the height and angle of the lower limit of the measurement range set in step S101.

In step S105, the control unit 8 performs an operation of acquiring information on a current height of the antenna mast 3 and the angle of the turntable 4 from the controller 6 and an operation of acquiring a measured value obtained by the receiver 5 measuring the electric field intensity, and stores each piece of information in the storage device 13 of the computer 7.

In step S106, the control unit 8 performs an operation of rotating the turntable 4 at the angular interval calculated in step S103.

In step S107, the control unit 8 performs an operation of acquiring the current angle information of the turntable 4 from the controller 6, and the control unit 8 performs determining of whether or not the current angle of the turntable is the upper limit angle of the measurement range set in step S101. In a case where the current angle of the turntable is not the upper limit angle, the process returns to step S105. In a case where the current angle of the turntable is the upper limit angle, the process proceeds to step S108.

In step S108, the control unit 8 performs an operation of raising the antenna mast 3 to the height calculated in step S102.

In step S109, the control unit 8 performs an operation of acquiring the current height information of the antenna mast 3 from the controller 6, and the control unit 8 performs determining of whether or not the current antenna height is the upper limit height of the measurement range set in step S101. In a case where the current antenna height is not the upper limit height, the process returns to step S105. In a where the current antenna height is the upper limit height, the process proceeds to step S110.

In step S110, the arithmetic processing unit 9 reads the electric field intensity distribution measured in steps S105 to S109 from the storage device 13, and performs an operation of interpolating zero to the electric field intensity between two adjacent measurement points in the frequency to be measured. "$\Delta h_{rx}(h_{rx})$" is calculated so that a value obtained by dividing "$K_{hmax}\Delta h_{rx}(h_{rx})$" determined in step S102 by an arbitrary positive integer is constant, and the point to be interpolated in the height direction at that time is determined so that the measurement point and the interpolation point satisfy Expression (16). In addition, in a case of interpolating in the angular direction, an interval between the measurement point and the interpolation point and an interval between each of interpolation points are set to be equidistant intervals.

In step S111, the arithmetic processing unit 9 performs an operation of applying a digital low pass filter of which a cut-off frequency is the frequency to be measured to the electric field intensity distribution in which zero is interpolated in step S110. Note that a sampling frequency when interpolating in the height direction is given by the following Expression (17). In addition, a sampling frequency when interpolating in the angular direction is given by the following Expression (18).

$$f_{interpol} = \frac{n\lambda f_{meas}}{K_{hmax}\Delta h_{rx}(h_{rx})} \quad (17)$$

where, $f_{meas}$ is the frequency to be measured.

$$f_{interpol} = \frac{2f_{meas}\Delta\theta_{rx}}{\Delta\theta_{interpol}} \quad (18)$$

where, $\theta_{interpol}$ is the angular interval after interpolation of zero.

In step S112, the arithmetic processing unit 9 performs an operation of specifying the maximum electric field intensity position from the electric field intensity distribution obtained in step S111.

In a case where there are a plurality of frequencies to be measured, it is possible to specify maximum electric field intensity positions for each frequency by repeating steps S101 to S112.

Alternatively, in step S103, a frequency characteristic of the electric field intensity is acquired by the receiver 5, and after information on the frequency characteristic is stored in the computer 7, steps S110 to S112 are repeated for each frequency are repeated. Therefore, it is possible to specify maximum electric field intensity positions for each frequency. In that case, the frequency used for calculating the measurement interval is a maximum frequency of the frequency characteristic to be measured.

Figure 5:
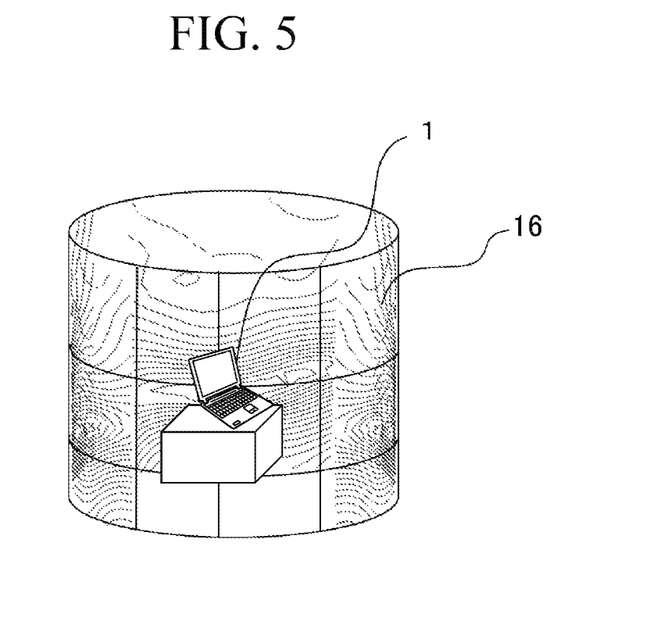
FIG. 5 is an explanatory diagram showing an outline of the maximum electric field intensity position estimation method according to the embodiment of the present invention.
Figure 6:
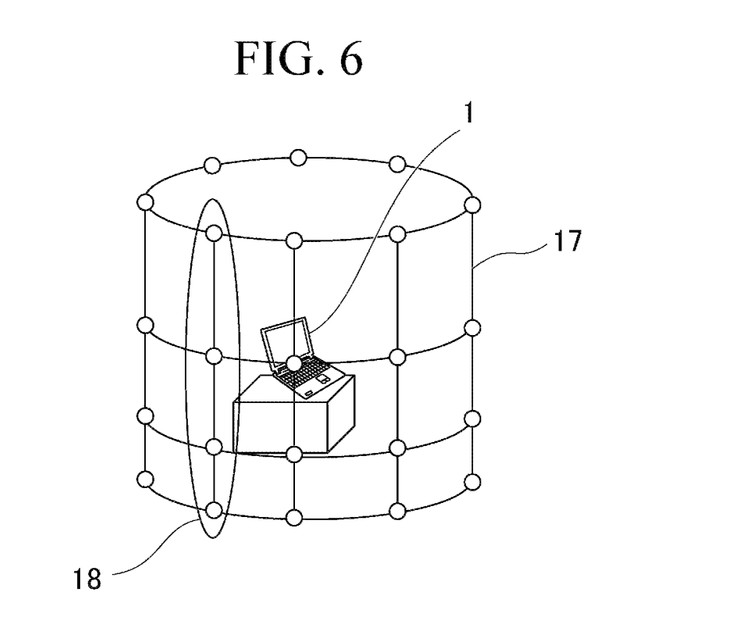
FIG. 6 is an explanatory diagram showing the outline of the maximum electric field intensity position estimation method according to the embodiment of the present invention.
Figure 7:
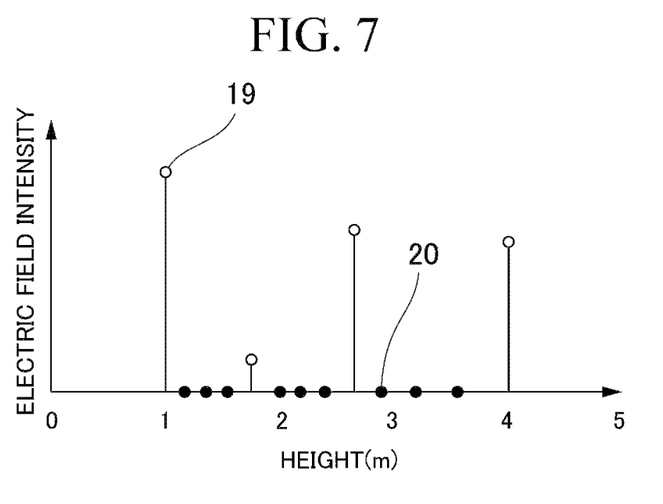
FIG. 7 is an explanatory diagram showing the outline of the maximum electric field intensity position estimation method according to the embodiment of the present invention.
Figure 8:
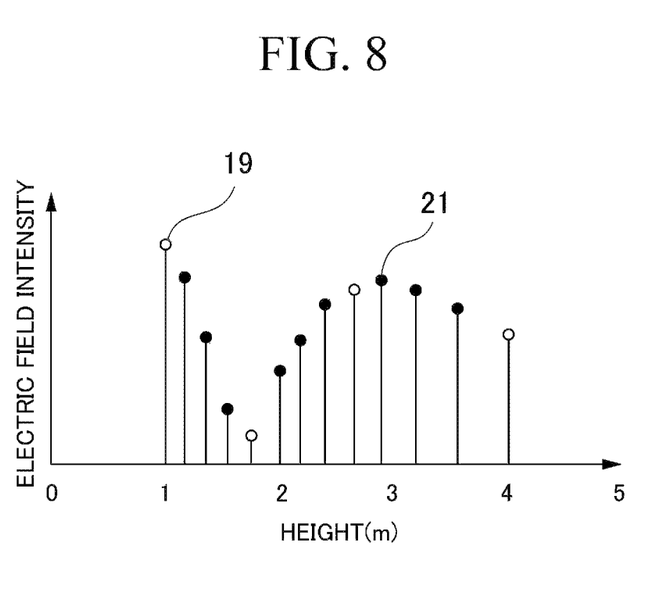
FIG. 8 is an explanatory diagram showing the outline of the maximum electric field intensity position estimation method according to the embodiment of the present invention.

Hereinafter, the maximum electric field intensity position estimation method performed by the radiation interference wave measurement device 100 according to the embodiment of the present invention will be described in detail with reference to the drawings. FIG. 5 is an explanatory diagram showing an outline of the maximum electric field intensity position estimation method. FIGS. 6 to 8 are explanatory diagrams showing an example of a flow of the maximum electric field intensity position estimation method showing the maximum electric field intensity position estimation method.

As shown in FIG. 5, the maximum electric field intensity position estimation method according to the present embodiment is an estimation method for obtaining a position at which the maximum electric field intensity is able to be obtained in an electric field intensity distribution 16 formed on a surface surrounding the radiation source by the radiation source of the electromagnetic wave included in the specimen 1. The maximum electric field intensity position estimation method according to the present embodiment is used, for example, in a test for measuring a radiation interference wave radiated from a radiation source of an electromagnetic wave included in a specimen 1 in accordance with an EMC standard.

The maximum electric field intensity position estimation method according to the present embodiment includes the following first to fifth procedures. The first to fifth procedures will be described with reference to FIGS. 6 to 8. Note that, the first procedure corresponds to steps S101 to S103 of FIG. 4 described above, the second procedure corresponds to steps S104 to S109 of FIG. 4 described above, the third procedure corresponds to step S110 of FIG. 4 described above, the fourth procedure corresponds to step S111 of FIG. 4 described above, and the fifth procedure corresponds to step S112 of FIG. 4 described above, respectively.

In the first procedure, as shown in FIG. 6, a plurality of measurement points 17 are set on the surface surrounding the radiation source of the electromagnetic wave included in the specimen 1. The positions in the height direction of the plurality of measurement points 17 at this time are given by using Expression (6), Expression (7), Expression (8), and Expression (16). In addition, the angular interval of the plurality of measurement points 17 is given by using Expression (14) and Expression (15).

In the second procedure, the electric field intensity distribution of the frequency to be measured is measured at the plurality of measurement points 17 set in the first procedure.

In the third procedure, zero is interpolated to the field intensity between two adjacent measurement points. At this time, one point or a plurality of points are able to be provided as the number of points at which zero is interpolated. In addition, the interval between the measurement point and the point at which zero is interpolated and the interval between the points at which zero is interpolated are able to arbitrarily set by a measurer. However, it is necessary to satisfy the condition of Expression (16) in the height direction and the condition that the interval between the measurement point and interpolation point and the interval between each of interpolation points are equidistant intervals in the angular direction. FIG. 7 is an explanatory diagram showing the third procedure and shows the electric field intensity distribution formed by an electric field intensity 19 of the measurement point in a measurement point range 18 shown in FIG. 6 and an electric field intensity 20 of the point at which zero is interpolated at an interval at which "$K_{hmax}\Delta h_{rx}(h_{rx})/4$" is constant between the two adjacent measurement points, as an example, in the explanatory diagram showing the third procedure.

In the fourth procedure, the digital low pass filter of which the frequency to be measure is the cutoff frequency is applied to the field intensity distribution obtained in the third procedure. Although the electric field intensity distribution in which zero is interpolated has a frequency component higher than the measured frequency, actually the electric field intensity distribution is bandlimited in the frequency to be measured according to Expression (1), and by applying the digital low pass filter of which the cut-off frequency is the frequency to be measured, it is possible to remove a high frequency component generated by the zero interpolation and it is possible to reproduce an actual electric field intensity distribution. By performing the operation from the zero interpolation to the application of the digital low pass filter, the electric field intensity between the two adjacent measurement points is interpolated as a result, and an accurate electric field intensity between the two adjacent measurement points can be obtained. FIG. 8 is an explanatory diagram showing the third procedure and shows the electric field intensity distribution formed by the electric field intensity 19 of the measurement point at which the digital low pass filter of which the cut-off frequency is 300 MHz is applied to the electric field distribution shown in FIG. 7 and an electric field intensity distribution 21 between the two interpolated measurement points, as an example.

In the fifth procedure, the maximum electric field intensity position is estimated from the electric field intensity distribution obtained by the fourth procedure. For example, FIG. 8 shows the electric field intensity distribution obtained by the first to fourth procedures in the range 18 of the measurement point shown in FIG. 6, and it can be seen that the height position where the electric field intensity is the strongest in the range 18 is a height position of 1 m from the obtained electric field distribution. By repeating these at each angle, it is possible to obtain a height at which the strongest electric field intensity is able to be obtained in a predetermined height range for each angle. It is possible to specify the angle and the height at which the maximum electric field intensity is able to be obtained by comparing the obtained strongest electric field intensities in the predetermined height range for each angle.

[Verification Experiment]

Figure 9:
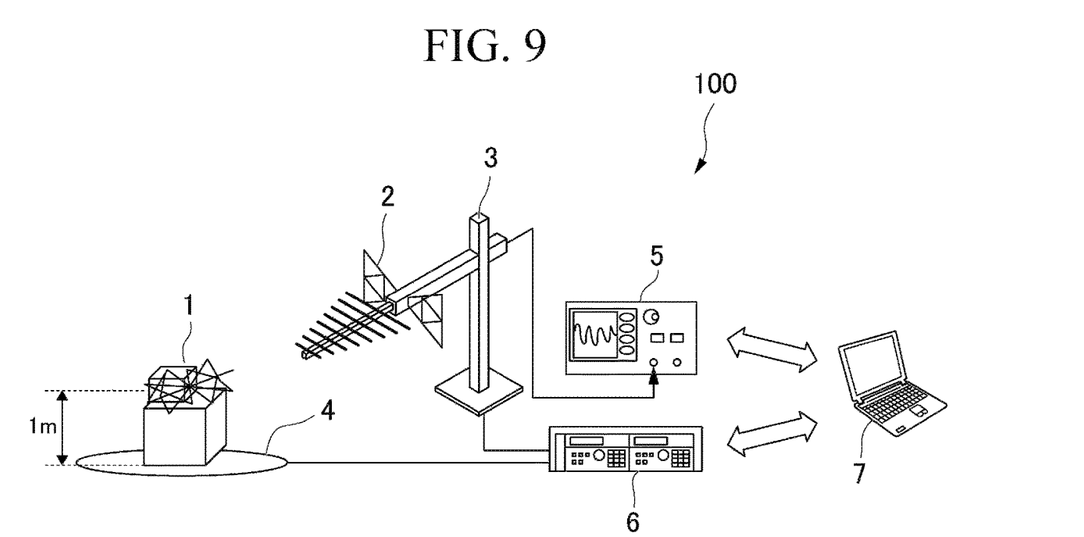
FIG. 9 is a schematic diagram of an experiment performed to verify the validity of the radiation interference wave measurement device according to the embodiment of the present invention.

Hereinafter, an experiment performed to verify the validity of the radiation interference wave measurement device 100 according to the embodiment of the present invention will be described with reference to FIGS. 9 to 11. FIG. 9 is an explanatory diagram showing a method of the experiment. In FIG. 9, parts corresponding to those in FIG. 1 are denoted by the same reference numerals. The specimen 1 includes the radiation source of the electromagnetic wave having the measurement frequency. The specimen 1 is disposed at a height of 1 m, and the reception antenna 2 is installed at a position 3 m away from the specimen 1. The radiation source of the specimen 1 to be measured is a comb generator that oscillates a signal multiplied by 10 MHz. The size of the specimen 1 is 0.2 m in length, 0.45 m in width, and 0.2 m in height. In addition, the height of the reception antenna 2 was swept from 1 m to 4 m. The measurement point is was set so that the measurement point in the height direction was "$K_{hmax}\Delta h_{rx}(h_{rx})=0.1299$", and the measurement of the electric field intensity at 1000 MHz was performed with the angular interval of 20° steps. In this case, the number of measurement points is 152 points, and it is possible to reduce the number of measurement points to about one twentieth as compared with the radiation disturbance wave measurement device of Japanese Unexamined Patent Application, First Publication No. 2017-181104.

In addition, in order to compare with the measurement result of the radiation interference wave measurement device 100 according to the embodiment of the present invention, the height interval and the angular interval were finely set and the measurement was performed. The measurement points were determined so that the height interval became "$K_{hmax}\Delta h_{rx}(h_{rx})=0.01299$" and the angular interval was 1° interval, and then the measurement is implemented. In this case, the number of measurement points is 50901 points, which is 334 times the above-described number of the measurement points "152 points" of the measurement point determined by the radiation interference wave measurement device 100 according to the embodiment of the present invention.

Figure 10:
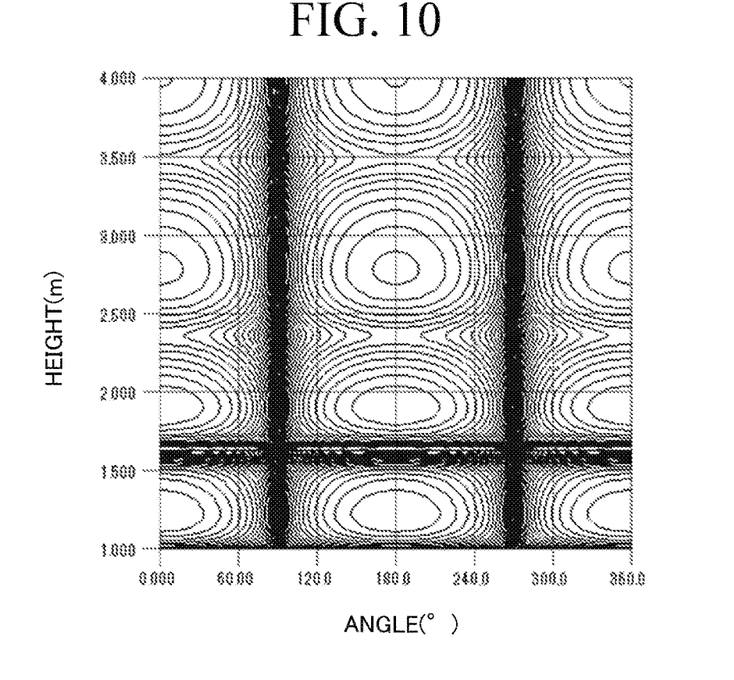
FIG. 10 is an electric field intensity distribution diagram showing an experiment result of the radiation interference wave measurement device according to the embodiment of the present invention.
Figure 11:
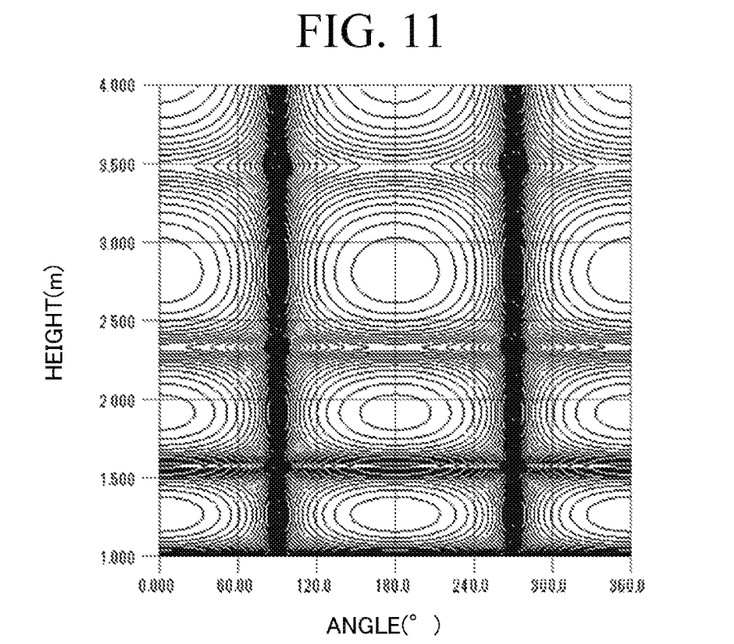
FIG. 11 is an electric field intensity distribution diagram for a comparison with the electric field intensity distribution diagram of FIG. 10.

FIG. 10 shows the electric field intensity distribution obtained by the number of measurement points "152 points" by the radiation interference wave measurement device 100 according to the embodiment of the present invention, and FIG. 11 shows the electric field intensity distribution obtained by performing the measurement at the number of measurement points "50901 points" at which the height interval and the angular interval are finely set. Both of FIGS. 10 and 11 show results of 1000 MHz. The electric field intensity distribution of FIG. 10 and the electric field intensity distribution of FIG. 11 preferentially coincide with each other, and the correlation coefficient thereof is 0.99, which shows a very strong correlation. In addition, the maximum electric field intensity position obtained from the electric field intensity distribution of the number of the measurement points "152 points" by the radiation interference wave measurement device 100 is 1.23 m in height and 0° in angle. The deviation between the maximum electric field intensity position "1.23 m in height and 0° in angle" and the maximum electric field intensity position obtained from the electric field intensity distribution of the number of the measurement points "50901 points" is 0.04 m in the height direction and 0° in the angular direction.

As described above, by using the radiation disturbance wave measurement device 100 according to the embodiment of the present invention, it is possible to shorten the measurement time by reducing the number of measurement points, and it is possible to specify the maximum electric field intensity position from the electric field intensity distribution restored from the measurement result.

Although the embodiment of the present invention has been described above in detail with reference to the drawings, a specific constitution is not limited to the embodiment, and a design change and the like within the scope without departing from the gist of the present invention are included.

For example, among the processes performed by the arithmetic processing unit 9 of the computer 7, an arithmetic processing unit that performs the electromagnetic wave measurement point calculation process (corresponding to steps S101 to S103 of FIG. 4) may be provided as another electromagnetic wave measurement point calculation device. In this case, the control unit 8 of the computer 7 executes the first operation of setting the plurality of measurement points calculated by the electromagnetic wave measurement point calculation device on the surface surrounding the radiation source.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

REFERENCE SIGNS LIST

1 Specimen
2 Reception antenna
3 Antenna mast
4 Turntable
5 Receiver
6 Controller
7 Computer
8 Control unit
9 Arithmetic processing unit
10 Main control unit
11 Input device
12 Output device
13 Storage device
14 Bus
15 Recording medium
16 Electric field intensity distribution
17 Measurement point
18 Measurement range
19 Electric field intensity of measurement point
20 Electric field intensity between two adjacent measurement points where zero is interpolated
21 Electric field intensity between two adjacent measurement points interpolated by digital filter
100 Radiation interference wave measurement device

What is claimed is:

1. A radiation interference wave measurement device comprising:
an electric field intensity measurement device comprising:
an antenna configured to detect an electric field intensity of an electric field intensity distribution formed on a surface surrounding a radiation source; and
a control unit configured to:
control measurement of the electric field intensity using the antenna; and
execute an operation of setting a plurality of measurement points of an electromagnetic wave set on the surface surrounding the radiation source of the electromagnetic wave; and
an electromagnetic wave measurement point calculation device configured to calculate the plurality of measurement points, the electromagnetic wave measurement point calculation device comprising:
a first arithmetic processing unit configured to:
calculate a correction coefficient according to a first measurement point and based on a distance between the radiation source and the antenna, a size of the radiation source, a height of the radiation source, and a height of the antenna;
calculate a measurement interval between the first measurement point and a second measurement point adjacent to the first measurement point using the correction coefficient, the correction coefficient being such that the measurement interval in a height direction on the surface surrounding the radiation source satisfies a sampling theorem; and
execute an electromagnetic wave measurement point calculation process for sequentially calculating the plurality of measurement points in a measurement range.

2. The radiation interference wave measurement device according to claim 1,
wherein the first arithmetic processing unit is configured to calculate the measurement interval in a height direction on the surface surrounding the radiation source by using Expression (1), Expression (2), and Expression (3), and is configured to calculate a position in a height direction of the plurality of measurement points in the measurement range by using Expression (4), $$K_{hmax}(h_{rx}) = \frac{h_{rx}+h_{max}}{\sqrt{d_{min}^2+(h_{rx}+h_{max})^2}} - \frac{h_{rx}-h_{max}}{\sqrt{d_{min}^2+(h_{rx}-h_{max})^2}} (h_{rx} \leq h_{max}) \qquad (1)$$

$$\frac{h_{rx}+h_{max}}{\sqrt{d_{min}^2+(h_{rx}+h_{max})^2}} - \frac{h_{rx}-h_{max}}{\sqrt{d_{max}^2+(h_{rx}-h_{max})^2}} (h_{rx} \geq h_{max})$$

$$\Delta h_{rx}(h_{rx}) \leq \frac{\lambda}{2K_{hmax}} \qquad (2)$$

$$\arctan\left(\frac{h_{rx\_min}+h_{min}}{d_{min}}\right) \leq \frac{\pi}{4} \qquad (3)$$

$$h_{rx,0} = h_{rx\_min} \qquad (4)$$
$$h_{rx,1} = h_{rx\_min} + \Delta h_{rx}(h_{rx,0})$$
$$h_{rx,k} = h_{rx,k-1} + \Delta h_{rx}(h_{rx,k-1})$$

$h_{rx}$ is the antenna height,
$d_{min}$ is a minimum value of a magnitude of a horizontal component of a vector between the radiation source and an observation point (antenna position),
$d_{max}$ is a maximum value of the magnitude of the horizontal component of the vector between the radiation source and an observation point (antenna position),
$h_{max}$ is a maximum height of the radiation source, and
$\lambda$ is a wavelength of the electromagnetic wave to be measured.

3. The radiation interference wave measurement device according to claim 1, wherein the first arithmetic processing unit is configured to calculate the measurement interval in an angular direction on the surface surrounding the radiation source by using Expression (5) and Expression (6), and is configured to calculate a position in the angular direction of the plurality of measurement points in the measurement range based on the measurement interval in the angular direction, $$\Delta\theta_{rx} \le \frac{\lambda}{4R_{max}} \tag{5}$$

$$\Delta\theta_{rx} \le \frac{\pi}{4} \tag{6}$$

$R_{max}$ is a maximum value of a horizontal component of a vector between a center of a specimen including the radiation source and the radiation source that is present in the specimen, and $\lambda$ is a wavelength of the electromagnetic wave to be measured.

4. A radiation interference wave measurement device that obtains a position at which a maximum electric field intensity of an electric field intensity distribution formed on a surface surrounding a radiation source is able to be obtained, the radiation interference wave measurement device comprising:
  an electromagnetic wave measurement point calculation device that is configured to calculate a plurality of measurement points of an electromagnetic wave set on the surface surrounding the radiation source of the electromagnetic wave, the electromagnetic wave measurement point calculation device comprising:
    a first arithmetic processing unit configured to:
      calculate a measurement interval between a first measurement point and a second measurement point adjacent to the first measurement point using a correction coefficient determined according to the first measurement point; and
      execute an electromagnetic wave measurement point calculation process for sequentially calculating the plurality of measurement points in a measurement range;
  an electric field intensity measurement device comprising:
    an antenna configured to detect an electric field intensity;
    a position control mechanism configured to change a relative position of the antenna with respect to the radiation source; and
    a control unit configured to:
      control measurement of the electric field intensity using the antenna and the position control mechanism;
      execute a first operation of setting the plurality of measurement points calculated by the electromagnetic wave measurement point calculation device on the surface surrounding the radiation source; and
      execute a second operation of measuring the electric field intensity of a frequency to be measured at the plurality of measurement points by using the antenna while controlling the position control mechanism; and
  a second arithmetic processing unit configured to perform:
    a first arithmetic process of inputting zero to the electric field intensity between two adjacent measurement points in the electric field intensity distribution of the plurality of measurement points measured by the second operation;
    a second arithmetic process of applying a digital low pass filter of which the frequency to be measured is a cut-off frequency to the electric field intensity distribution obtained by the first arithmetic process; and
    a third arithmetic process of specifying the position at which the maximum electric field intensity is able to be obtained from the electric field intensity distribution obtained by the second arithmetic process.

* * * * *